United States Patent [19]
Kühn et al.

[11] Patent Number: 5,648,123
[45] Date of Patent: Jul. 15, 1997

[54] PROCESS FOR PRODUCING A STRONG BOND BETWEEN COPPER LAYERS AND CERAMIC

[75] Inventors: Heinrich Kühn, Brechen; Ulrich Bos, Hochheim am Main; Carsten Hannss, Nossen; Karl-Friedrich von Kayser, Schlangenbad, all of Germany

[73] Assignee: Hoechst Aktiengesellschaft, Frankfurt am Main, Germany

[21] Appl. No.: 307,797

[22] PCT Filed: Mar. 19, 1993

[86] PCT No.: PCT/EP93/00675

§ 371 Date: Sep. 30, 1994

§ 102(e) Date: Sep. 30, 1994

[87] PCT Pub. No.: WO93/20255

PCT Pub. Date: Oct. 14, 1993

[30] Foreign Application Priority Data

Apr. 2, 1992 [DE] Germany ............................ 42 10 900.0

[51] Int. Cl.⁶ .................................................. C23C 4/08
[52] U.S. Cl. .................... 427/448; 427/455; 427/309; 427/350; 427/383.3; 427/383.5
[58] Field of Search ............................... 427/448, 455, 427/309, 350, 383.5, 383.3; 428/469

[56] References Cited

U.S. PATENT DOCUMENTS

| | | | |
|---|---|---|---|
| 4,297,439 | 10/1981 | Bergthaller et al. | 430/434 |
| 4,402,494 | 9/1983 | Senda et al. | 266/255 |
| 4,505,418 | 3/1985 | Neidig et al. | 228/122 |
| 4,609,408 | 9/1986 | Rodrigues et al. | 148/2 |
| 4,921,721 | 5/1990 | Matsui et al. | 427/309 |
| 5,005,557 | 4/1991 | Baechli | 126/441 |
| 5,009,218 | 4/1991 | Baechli | 126/452 |
| 5,058,799 | 10/1991 | Zsamboky | 427/309 |
| 5,183,553 | 2/1993 | Tenbrink et al. | 205/162 |
| 5,290,606 | 3/1994 | Hestevik et al. | 427/455 |

FOREIGN PATENT DOCUMENTS

| | | |
|---|---|---|
| 3036128 | 4/1982 | Germany. |
| 3038976 | 4/1982 | Germany. |
| 3509022 | 11/1985 | Germany. |
| 3824249 | 1/1990 | Germany. |
| 56-33485 | 4/1981 | Japan .................... 427/455 |
| 61-231155 | 10/1986 | Japan. |
| 61-230761 | 10/1986 | Japan. |
| 62-47470 | 3/1987 | Japan. |
| 64-59887 | 3/1989 | Japan. |
| 3-85715 | 4/1991 | Japan. |

OTHER PUBLICATIONS

Thermal Spraying Handbook, Daily Industrial the Japanese Melt-Spraying Association issued May 31, 1964, p. 317.
Thermal Spraying Engineering issued on May 20, 1969, pp. 85 and 68.
Patent Abstracts of Germany, (Sep. 15, 1988), abstract of Bachli, "Heat Insulating Construction Or Lighting Element With Sealed Wall Elements Forming Evacuated Interspace, Useful For Double Or Triple Glazed Windo, Solar Collector, etc.", German No. 3684600.
Patent Abstract of Soviet, (Jan. 22, 1992), "Coating Of Metals And Alloys With Powders–Using High Velocity Gas Powder Stream With Improved Efficiency And Productivity", Week 9148.

*Primary Examiner*—Katherine Bareford
*Attorney, Agent, or Firm*—Foley & Lardner

[57] ABSTRACT

The invention relates to a process for producing a strong bond between copper layers, which have been applied by means of thermal spraying of pulverulent copper or copper alloys, and ceramic. Fine copper powder having a mean particle diameter of ≦20 μm is applied to the ceramic surface by means of thermal spraying.

19 Claims, 1 Drawing Sheet

5,648,123

PROCESS FOR PRODUCING A STRONG BOND BETWEEN COPPER LAYERS AND CERAMIC

This is a national stage application of PCT/EP93/00675, filed Mar. 19, 1993.

BACKGROUND OF THE INVENTION

1. Field of the Invention

The invention relates to a process for producing a strong bond between copper layers, which have been applied by means of thermal spraying of pulverulent copper or copper alloys, and ceramic.

2. Description of Related Art

The bonding of copper as highly electrically conductive metal to oxide ceramic as readily thermally conductive insulator is of particular industrial importance in the field of electronic components. The copper layer is used as strip-conductor layer, electrode layer, sensor layer or else as connecting layer in the soldering of oxide ceramic as heat sink onto other components which develop a particularly high amount of heat.

Various processes are already known for the direct application of copper to ceramic. DE-A-38 24 249 describes, for example, deposition without external current after prior toughening of the ceramic surface and the subsequent palladium nucleation with subsequent heat treatment. This process has the disadvantage of allowing only metal layers having a maximum thickness of up to 5 μm.

DE-A-30 36 128 describes the direct copper bonding process (DCB), in which a copper sheet having a thickness of from 100 to 900 μm is applied to the ceramic surface at a temperature of about 1070° C. The DCB process is, however, only economic if layers having thicknesses of more than 100 μm are to be applied.

A base metallization by means of cathode atomization in vacuo or as described in DE-A-28 24 249 and subsequent electrolytic deposition of copper can be economically carried out for a layer thickness of up to a maximum of 50 μm. The bond strength between the applied layer and the ceramic material can be, in the case of cathode atomization, increased by a so-called coupling layer of chromium, titanium, inter alia, but this coupling layer leads to considerable disadvantages in the further processing of the strip conductors by etching.

Application of copper by sputtering in a vacuum chamber with a prior plasma etching process in the same vacuum chamber is economically possible only up to a layer thickness of from 1 to 2 μm.

In thermal spraying, it is known that copper can be applied both to metallic and to nonmetallic materials. Uses of such coatings are the improvement of the contact resistance or the application of solderable compounds and the like to the materials. The layers thus applied have, owing to the oxidation of the copper during the application process, a high electrical resistance in comparison to pure electrolytic copper. The various thermal spraying processes in vacuo or in chambers of protective gas are technically very complicated and can hardly be economically used in mass production, having regard to the component geometry of the electronic components.

In addition, the exceptionally high dimensional accuracy of the surface geometry required in modern high technology is only possible by means of further costly mechanical treatment in the known process steps, for some parts it cannot be achieved at all.

SUMMARY OF THE INVENTION

It is therefore an object of the invention to apply copper or copper alloys to ceramic components by thermal spraying in such a way that a simple process enables production of sufficiently strongly bonded layers having any desired thickness in the broad range of 5 μm–300 μm and having an electrical conductivity close to that of electrolytic copper, which layers also simultaneously have a low variation in thickness.

This object is achieved by a process of the generic type mentioned in the introduction, whose distinguishing feature is that a fine copper powder having a mean particle diameter of ≦20 μm is applied to the ceramic surface by means of thermal spraying.

DETAILED DESCRIPTION

Figure 1:
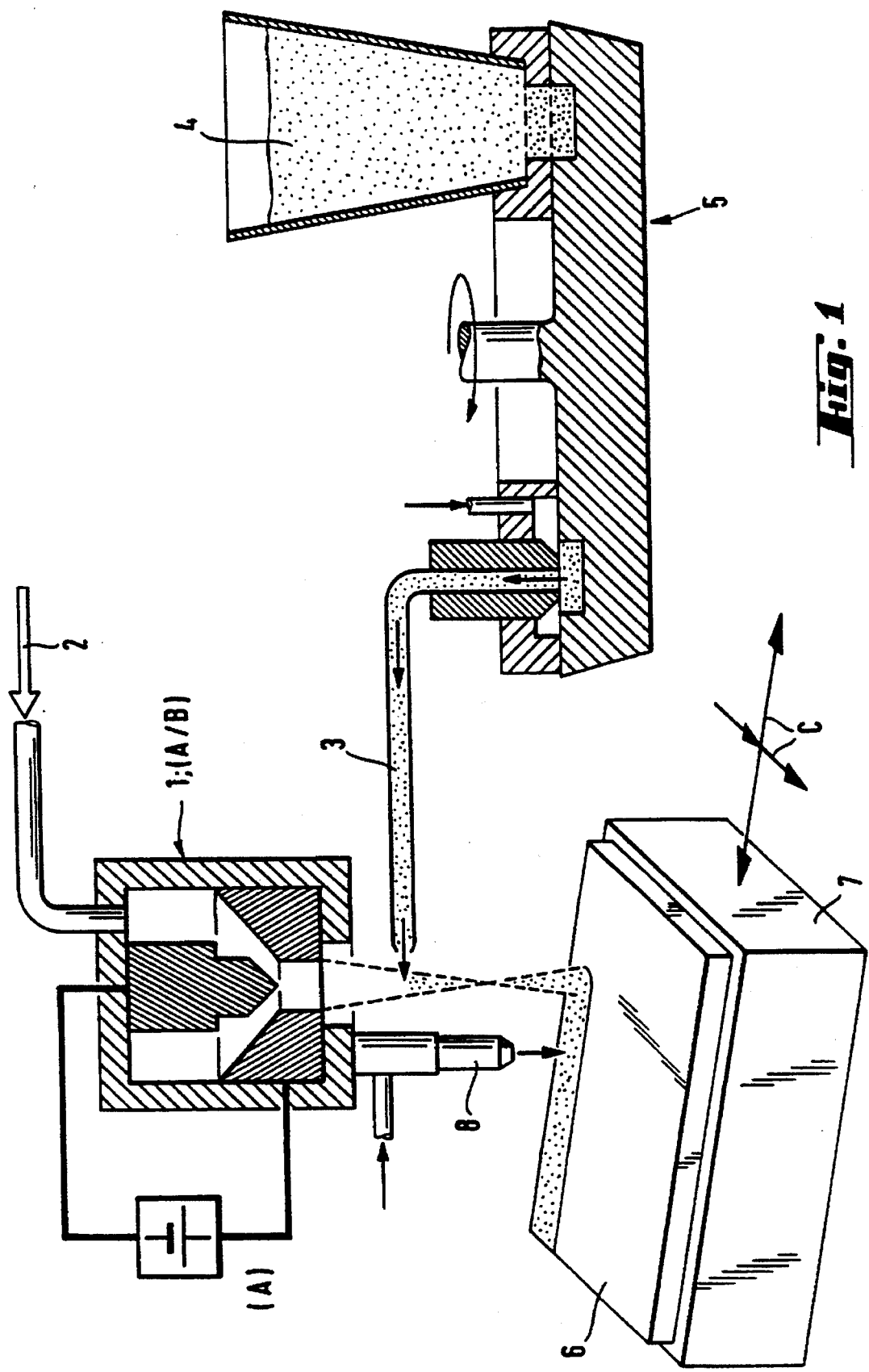
FIG. 1 schematically illustrates the coating process of the present invention.

Ceramic materials which have been found to be suitable according to the invention are, in particular, oxide ceramic materials such as aluminum oxide, beryllium oxide or zirconium oxide, but nonoxidic ceramic materials such as, for example, aluminum nitride are also very advantageous possibilities. According to a particularly advantageous embodiment of the process of the invention, the ceramic surface is first subjected to a roughening process without the surface geometry being greatly altered. Preferably, the surface of aluminum oxide substrates having a purity in the range from 90 to 100% (aluminum oxide) is treated with mineral acids, in particular with a mixture containing sulfuric acid and phosphoric acid in a ratio of 1:1 for a time of about 45 minutes at a temperature of at least about 180° C., preferably in the range from 220° to 260° C. The surface is then rinsed with water and subsequently dried at from 150° to 200° C. in a circulating-air oven. The drying time is a number of hours, preferably at least 24 hours. The surface roughness $R_z$ of aluminum oxide substrates treated in this way is in the range from 2 to 5 μm, measured in accordance with DIN 4768.

Alternatively, instead of using mineral acids, the ceramic surface can be prepared for the application of the copper layer by treatment in a sand-blasting process. Preferably, a roughening of the surface can be provided for this purpose using sand-blasting appliances, with suitable blasting abrasives being, preferably, mineral blasting material such as fine silicon carbide, aluminum oxide, inter alia. According to the invention, preferred blasting conditions are a blasting pressure in the range from 4 to 6 bar, a particle size in the range from 10 to 80 μm, a distance from the nozzle to the surface to be treated in the range from 100 to 150 mm and a movement of the nozzle across the treated surface at a speed in the range from 0.5 to 1 m/sec.

The alternative roughening process is advantageously followed by a cleaning process which is carried out, for example, with the aid of ultrasound in an alcoholic bath, preferably in isopropanol, or alternatively in hot sulfuric acid at a temperature in the range from 140° to 160° C. The cleaning process ensures, for the purposes of the invention, that any contaminants still present on the surface are effectively removed. After drying the cleaned surface at temperatures in the range from 150° to 200° C. in a circulating-air oven, such surfaces can likewise be coated according to the invention.

The application of copper and copper alloys is carried out, according to the invention, by thermal spraying of pulverulent material. The methods which are preferably used according to the invention are plasma spraying and high-speed flame spraying. The nature of the powder is matched to the different thermal spraying processes and the application. The copper powder preferably has, according to the invention, a particle size $d_{50}$ in the range from 8 to 12 µm, which is determined by the Silas laser light scattering method. The copper or the copper alloy advantageously has a purity of at least 99%, based on those constituents which impair the electrical conductivity. As alloy constituents, noble metals such as silver, gold or palladium can be alloyed with the copper in amounts of up to 30% by weight. The phosphorus content of the copper or the copper alloy is in the range from 0.08 to 0.15% by weight and is determined photometrically, while the oxygen content is in the range from 0.2 to 0.3% by weight and is determined by hot extraction in an inert gas stream. It has surprisingly been found that a phosphorus content of preferably from 0.10 to 0.12% by weight does not interfere with the electrical conductivity but, on the contrary, exercises positive effects on the oxidation behavior of the copper layer applied.

In the plasma spraying process, the plasma gas used is an inert gas such as nitrogen, hydrogen or a noble gas and/or mixtures thereof, preferably argon in an amount in the range from 30 to 60 l/min. The electrical power of the plasma burner is preferably from 10 to 15 kW, particularly preferably 12 kW, with the burner being moved across the substrate to be coated at a distance in the range from 40 to 100 mm, preferably from 40 to 70 mm, and at a speed of from 10 to 100 m/min. Under such conditions, an application rate in the range from 2 to 8 kg/h is achieved according to the invention.

The ceramic components to be coated are preferably cooled during the coating process, to keep oxide formation low and to prevent residual stresses both in the coating and in the body being coated. For this purpose, preference is given to using $CO_2$ in a finely crystalline or liquid form at a high pressure of from about 40 to 60 bar. Although it is known that $CO_2$ is used in liquid form for cooling in thermal spraying, it is surprising to those skilled in the art that there simultaneously occurs a blasting of the surface by $CO_2$, by which means embedding of strongly oxidized, very small interfering particles in the coating is suppressed.

Copper layers applied by the process of the invention can have a thickness in the range from 5 to 300 µm, with the thickness varying by about 20% within relatively thin layers and by only about 5% within relatively thick layers. The bond strength of the layers, which is measured by pulling off from the face in accordance with DIN 50 160, is in the range from 3 to 10 MPa. To further improve the bond strength of the applied layers, there is provided within the scope of the present invention an additional subsequent heat treatment. The subsequent heat treatment is carried out in a tunnel kiln having various heating zones at temperatures of from 600° to 800° C. and extends over a time of at least 5 minutes, preferably, in the case of relatively thick layers, at least 10 minutes. The heat treatment is carried out in the presence of a reducing atmosphere or in vacuo, with a mixture of 95% of argon and 5% of hydrogen being particularly suitable as reducing atmosphere. The electrical conductivity of the layers thus produced is typically in the range from 30 to 57 $m/\Omega \cdot mm^2$, preferably from 40 to 57 $m/\Omega \cdot mm^2$.

FIG. 1 schematically shows how the coating process of the invention can be carried out. In detail there are shown, using reference numbers, the plasma burner 1 into which the plasma gas 2 is introduced. The copper powder 4 is initially charged in a metering apparatus 5, is fed together with a powder carrier gas via a feed pipe 3 into the hot gas stream and then deposits on the ceramic plate 6. The ceramic plate 6 is mounted on an advancing facility 7 movable in the directions C and is cooled by means of the carbon dioxide cooling 8. The apparatus shown can be used, as desired, for plasma spraying A or for high-speed flame spraying B.

It has surprisingly been found that the coated ceramic components obtained by the production process of the invention are particularly suitable for use in photolithographic structuring of electrical strip conductors, with such strip conductors having, in particular, an electrical conductivity of at least 30 $m/\Omega \cdot mm^2$ and a bond strength of at least 20 MPa and can be machine soldered, advantageously without flux.

The invention is illustrated by the following examples, but without being limited to the concrete embodiments described.

EXAMPLES

Example 1

An aluminum oxide plate was roughened using a mixture of sulfuric acid and phosphoric acid (mixing ratio 1:1) at a temperature of 240° C. for a period of 45 minutes. The plate had geometric measurements of 100×100 mm edge length and a thickness of 0.6 mm and was coated using a plasma spraying facility as shown in FIG. 1, after it had been rinsed with water and dried at 200° C. for a period of 40 hours in an oven. The plate then had a surface roughness $R_z$ (DIN 4768) of 3.5 µm. The plate was coated with a copper powder having a particle size $d_{50}$ of from 8 to 10 µm by the plasma spraying process. The plasma gas used was argon in an amount of 40 l/min. The burner power was 12 kW and the burner was moved across the plate at a distance of 60 mm at a speed of 40 m/min. For cooling, $CO_2$ was sprayed on in liquid form from two nozzles at a pressure of 60 bar.

The copper layer thus produced had a thickness of 75 µm and a surface roughness $R_z$ of from 8 to 10 µm (DIN 4768). Its electrical conductivity was 6 $m/\Omega \cdot mm^2$, the bond strength was measured as 5 MPa. The coated plate was then subjected to subsequent heat treatment in a multi-zone tunnel kiln at temperatures of 600° and 800° C. over a period of 10 minutes under an atmosphere containing 95% of argon and 5% of hydrogen. The conductivity of the copper layer was then 35 $m/\Omega \cdot mm^2$, the bond strength was 30 MPa.

Example 2

An aluminum oxide plate as described in Example 1 was, under the same conditions as in Example 1, coated with a copper layer which, however, had a thickness of only 30 µm. After subsequent heat treatment under the same conditions as in Example 1, the conductivity of the applied copper layer was measured and gave a value of 45 $m/\Omega \cdot mm^2$, the bond strength was 31 MPa.

Comparative Example

An aluminum oxide plate pretreated in the same manner as described in Example 1 was coated with a conventional copper powder having an average particle size in the range from 40 to 80 µm by the plasma spraying process. During plasma spraying, an application rate of 7 kg/h was set at a burner power of 27 kW. The plasma gas used was a mixture of nitrogen and hydrogen having a mixing ratio of 15:1. The distance of the burner from the workpiece was 125 mm.

20% of the coated plates were destroyed by the hot gas jet as a result of excessive evolution of heat. The copper layer produced in accordance with the comparative example had a surface structure having a roughness $R_z$ of greater than 30 µm. The measurement of the electrical conductivity gave a value of less than 5 m/Ω·mm$^2$.

What is claimed is:

1. A process for producing a bond between copper and ceramic, wherein said copper has been applied by thermal spraying pulverulent copper or copper alloys, said process comprising applying fine powder of copper or copper alloys having a mean particle diameter of $\leq 20$ µm to a ceramic surface by thermal spraying said copper or copper alloys, wherein the surface roughness $R_z$ of the coated copper or copper alloys is in the range of $\leq 10$ µm.

2. The process as claimed in claim 1, wherein the ceramic material used is selected from the group consisting of aluminum oxide, beryllium oxide, zirconium oxide and aluminum nitride.

3. The process as claimed in claim 1, wherein the ceramic surface is subjected to a roughening process, and is cleaned and dried at temperatures of at least 180° C. for a period of at least 24 hours, prior to applying the fine powder of copper or copper alloys.

4. The process as claimed in claim 3, wherein said roughening process comprises treating a surface of said ceramic component with mineral acids.

5. The process as claimed in claim 3, wherein said ceramic has a surface roughness $R_z$ of from about 2 to 5 µm prior to coating.

6. The process as claimed in claim 1, wherein the thermal spraying method used is plasma spraying.

7. The process as claimed in claim 1, wherein the powder of copper or a copper alloy has a particle size $d_{50}$ in the range from 8 to 12µm, and noble metals selected from the group consisting of silver, gold and palladium in amounts of up to 30% are alloyed with the copper as alloy constituents.

8. The process as claimed in claim 1, wherein the copper powder has a purity of at least 99%, with its phosphorus content being in the range from 0.08 to 0.15% and its oxygen content being in the range from 0.2 to 0.3.

9. The process as claimed in claim 1, wherein the coated ceramic is additionally subjected to subsequent heat treatment in a reducing atmosphere at temperatures in the range from 600° to 800° C. over a period of at least 5 minutes.

10. The process as claimed in claim 1, wherein the ceramic to be coated is cooled during the coating process.

11. The process as claimed in claim 10, wherein cooling is carried out using $CO_2$ in crystalline or liquid form at pressures in the range of from 40 to 60 bar.

12. The process as claimed in claim 1, wherein the thermal spraying method used is flame spraying.

13. A process for producing a bond between copper and ceramic, wherein said copper has been applied by thermal spraying pulverulent copper or copper alloys, said process comprising applying in a single pass, fine powder of copper or copper alloys having a mean particle diameter of $\leq 20$ µm to a ceramic surface by thermal spraying said copper or copper alloys, wherein the surface roughness $R_z$ of the coated copper or copper alloys is in the range of $\leq 10$µm.

14. The process as claimed in claim 13, wherein the ceramic surface is subjected to a roughening process, and is cleaned and dried at temperatures of at least 180° C. for a period of at least 24 hours, prior to applying the fine powder of copper or copper alloys.

15. The process as claimed in claim 14, wherein said ceramic has a surface roughness $R_z$ of from about 2 to 5 µm prior to coating.

16. The process as claimed in claim 13, wherein the coated ceramic component is additionally subjected to subsequent heat treatment in a reducing atmosphere at temperatures in the range from 600° to 800° C. over a period of at least 5 minutes.

17. The process as claimed in claim 13, wherein cooling is carried out using $CO_2$ in crystalline or liquid form.

18. In a process of photolithographic structuring of electrical strip conductors, the improvement comprising using, as the ceramic component of the electrical strip conductor, a coated ceramic component prepared by coating a ceramic component with copper by producing a bond between copper and said ceramic component by applying a fine powder of copper or copper alloys having a mean particle diameter of $\leq 20$ µm to a surface of the ceramic component by thermal spraying, wherein said copper or copper alloys coating has a surface roughness $R_z$ the range of $\leq 10$ µm.

19. The process as claimed in claim 18, wherein the coated ceramic component is additionally subjected to subsequent heat treatment in a reducing atmosphere at temperatures in the range of from 600° to 800° C. over a period of at least 5 minutes, wherein said strip conductors have an electrical conductivity of at least 30 m/Ω·mm$^2$ and a bond strength of at least 20 MPa.

* * * * *